(12) United States Patent
Hong

(10) Patent No.: US 9,882,162 B2
(45) Date of Patent: Jan. 30, 2018

(54) ENCAPSULATION STRUCTURE, ENCAPSULATING METHOD AND DISPLAY DEVICE

(71) Applicant: BOE TECHNOLOGY GROUP CO., LTD., Beijing (CN)

(72) Inventor: Rui Hong, Beijing (CN)

(73) Assignee: BOE TECHNOLOGY GROUP CO., LTD., Beijing (CN)

( * ) Notice: Subject to any disclaimer, the term of this patent is extended or adjusted under 35 U.S.C. 154(b) by 0 days.

(21) Appl. No.: 15/104,415

(22) PCT Filed: Feb. 26, 2016

(86) PCT No.: PCT/CN2016/074674
§ 371 (c)(1),
(2) Date: Jun. 14, 2016

(87) PCT Pub. No.: WO2016/145980
PCT Pub. Date: Sep. 22, 2016

(65) Prior Publication Data
US 2017/0133624 A1    May 11, 2017

(30) Foreign Application Priority Data
Mar. 16, 2015 (CN) .......................... 2015 1 0114389

(51) Int. Cl.
*H01L 51/00*   (2006.01)
*H01L 51/52*   (2006.01)
(Continued)

(52) U.S. Cl.
CPC .......... *H01L 51/5243* (2013.01); *H01L 27/32* (2013.01); *H01L 51/529* (2013.01);
(Continued)

(58) Field of Classification Search
CPC ..... H01L 51/5243; H01L 51/56; H01L 27/32; H01L 51/529; H01L 51/5246;
(Continued)

(56) References Cited

U.S. PATENT DOCUMENTS 4,262,060 A * 4/1981 Shikata .................. C25D 3/562
126/569
6,717,052 B2 * 4/2004 Wang ..................... H05B 33/04
174/381
(Continued)

FOREIGN PATENT DOCUMENTS

CN    1703123 A    11/2005
CN    1925155 A     3/2007
(Continued)

OTHER PUBLICATIONS

Office Action from corresponding Chinese Application No. 201510114389.7, Feb. 24, 2017 (8 pages).
(Continued)

*Primary Examiner* — Vu A Vu
(74) *Attorney, Agent, or Firm* — Harness, Dickey & Pierce, P.L.C.

(57) ABSTRACT

Embodiments of the present disclosure disclose an encapsulation structure, an encapsulating method and a display device. The encapsulation structure includes a first substrate and a second substrate arranged opposite to each other, and a sealing structure provided between the first substrate and the second substrate. Wherein the sealing structure is provided with one or more voids, and a filler is provided within the one or more voids and includes a gas-absorbing material.

18 Claims, 2 Drawing Sheets

(51) Int. Cl.
*H01L 51/56* (2006.01)
*H01L 27/32* (2006.01)
*H05B 33/04* (2006.01)

(52) U.S. Cl.
CPC ...... *H01L 51/5246* (2013.01); *H01L 51/5259* (2013.01); *H01L 51/56* (2013.01); *H01J 2217/49264* (2013.01); *H01L 27/322* (2013.01); *H01L 27/3246* (2013.01); *H01L 51/5253* (2013.01); *H05B 33/04* (2013.01)

(58) Field of Classification Search
CPC ............. H01L 51/5259; H01L 51/5253; H01L 27/322; H01L 27/3246; H05B 33/04; H01J 2217/49264
USPC .......................................................... 257/40
See application file for complete search history.

(56) References Cited

U.S. PATENT DOCUMENTS

| | | | | |
|---|---|---|---|---|
| 7,876,043 B2* | 1/2011 | Sakurai | ................. | H01L 51/524 313/506 |
| 8,148,885 B2* | 4/2012 | Tremel | .................... | H01L 23/26 313/483 |
| 8,946,759 B2* | 2/2015 | Moon | ................. | H01L 51/5246 257/40 |
| 2014/0191204 A1* | 7/2014 | Jeong | .................... | H01L 27/322 257/40 |
| 2015/0021559 A1* | 1/2015 | Han | ...................... | H01L 51/524 257/40 |

FOREIGN PATENT DOCUMENTS

| | | |
|---|---|---|
| CN | 102648543 A | 8/2012 |
| CN | 102720286 A | 10/2012 |
| CN | 102956675 A | 3/2013 |
| CN | 103035765 A | 4/2013 |
| CN | 103855186 A | 6/2014 |
| CN | 104037196 A | 9/2014 |
| CN | 104659073 A | 5/2015 |
| WO | WO-2015015221 A1 | 2/2015 |

OTHER PUBLICATIONS

Written Opinion of the International Searching Authority from corresponding PCT Application No. PCT/CN2016/074674, dated Apr. 14, 2016 (5 pages).

* cited by examiner

ENCAPSULATION STRUCTURE, ENCAPSULATING METHOD AND DISPLAY DEVICE

CROSS-REFERENCE TO RELATED APPLICATION

This application claims priority of a Chinese Patent Application No. 201510114389.7, which was filed on Mar. 16, 2015, the disclosure of which is incorporated herein by reference in its entirety.

FIELD

The present disclosure relates to the field of display technology, and in particular to an encapsulation structure, an encapsulating method and a display device.

BACKGROUND

In the field of photoelectric display, Organic Light Emitting Diode (OLED) has many advantages, such as active light-emitting, high brightness, high contrast, super-thinness, low power consumption, wide view field and broad working temperature range. Therefore an OLED device is an advanced, novel, and widely-applied flat panel display device.

Due to inherent characteristics of organic materials, they are inclined to absorb water and oxygen and deteriorate after being affected by the absorbed water and oxygen, which results in short service life for the OLED device. Therefore it is a quite challenging task in the art about how to improve anti-water-oxygen performance of the OLED device.

BRIEF DESCRIPTION

Embodiments of the present disclosure provide different solutions for improving anti-water-oxygen performance of the OLED device.

According to a first aspect, an encapsulation structure is provided. The encapsulation structure includes a first substrate and a second substrate arranged opposite to each other, and a sealing structure provided between the first substrate and the second substrate. The sealing structure is provided with one or more voids, and a filler is provided within the one or more voids and includes a gas-absorbing material.

Further, the sealing structure includes a plurality of loop-like sealing units nested with one another; and there is a gap between any two neighboring loop-like sealing units so as to form the void.

Further, each of the plurality of loop-like sealing units has a width range of 0.3~1.0 mm, and a gap between any two neighboring loop-like sealing units has a width range of 0.1~1.0 mm.

Further, a number of the plurality of loop-like sealing units is within a range of 2~5.

Further, the gas-absorbing material is a mixture of alkaline earth metal oxide and molecular sieves.

Further, the alkaline earth metal oxide accounts for 60%~80% of the gas-absorbing material in terms of mass.

Further, the alkaline earth metal oxide includes at least one of magnesium oxide and calcium oxide.

Further, the filler further includes a heat-absorbing material.

Further, the heat-absorbing material includes metal particles having black nickel coating, black chromium coating, or black cobalt coating.

Further, the filler includes a plurality of spherical particles having the gas-absorbing material and the heat-absorbing material.

Further, a particle diameter of each of the plurality of spherical particles is within a range of 0.05~0.2 mm.

In another aspect, a display device is provided, which includes any one of the above encapsulation structures.

In yet another aspect, an encapsulating method is provided, which includes: providing a first substrate; providing a second substrate; coupling the first substrate to the second substrate. A sealing structure is provided between the first substrate and the second substrate, the sealing structure is provided with one or more voids and non-void parts, and a filler is provided within the one or more voids and includes a gas-absorbing material.

Further, the encapsulating method further includes: irradiating an encapsulation region between the first substrate and the second substrate by using laser rays.

Further, the sealing structure includes a plurality of loop-like sealing units nested with one another; and there is a gap between any two neighboring loop-like sealing units so as to form the void.

Further, each of the plurality of loop-like sealing units has a width range of 0.3~1.0 mm, and a gap between any two neighboring loop-like sealing units has a width range of 0.1~1.0 mm.

Further, a number of the plurality of loop-like sealing units is within a range of 2~5.

Further, the gas-absorbing material is a mixture of alkaline earth metal oxide and molecular sieves.

Further, the alkaline earth metal oxide accounts for 60%~80% of the gas-absorbing material in terms of mass.

Further, the alkaline earth metal oxide includes at least one of magnesium oxide and calcium oxide.

Further, the non-void parts of sealing structure are formed by glass adhesive.

Further, the filler further includes a heat-absorbing material.

Further, the heat-absorbing material includes metal particles having black nickel coating, black chromium coating, or black cobalt coating.

According to embodiments of the present disclosure, within the encapsulation structure, there arranged one or more voids in a sealing structure and the one or more voids are provided with a gas-absorbing material. Accordingly, when the outer side of the sealing structure is subject to being worn out or damaged, the gas-absorbing material is inclined to absorb water vapor (moisture) in the air, which results in forming a buffer zone for further protection, thereby improving anti-water-oxygen performance of the OLED device and service lifespan of the display device greatly.

DETAILED DESCRIPTION

Specific embodiments of the present disclosure will be further described below in conjunction with the accompanying drawings and embodiments. The following embodiments are only used for illustrating the present disclosure, but are not intended to limit the scope of the disclosure. A person skilled in the art may obtain the other drawings without any creative effort Unless otherwise defined, technical terms or scientific terms used herein shall have the general meaning which can be understood by a person skilled in the art. The terms "first", "second" or the like used in the specification and claims of the present disclosure do not denote any sequence, quantity, or importance, but rather are used to distinguish different components. Similarly, the terms "a" or "an" or the like do not mean quantitative restrictions, but rather indicate the presence of at least one. The terms "connect" or "couple" or the like are not limited to connect physically or mechanically, but may include connecting electrically either directly or indirectly. The terms "up", "down", "left", "right", etc., are merely used to indicate a relative positional relationship; when the absolute position of the described object is changed, the relative positional relationship is changed correspondingly.

Figure 1:
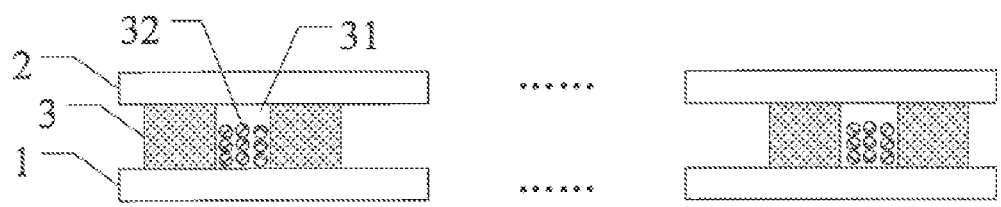
FIG. 1 is a cross sectional diagram illustrating an encapsulation structure provided by embodiments of the present disclosure.

FIG. 1 is a cross sectional diagram illustrating an encapsulation structure provided by embodiments of the present disclosure. The encapsulation structure includes a first substrate 1 and a second substrate 2 arranged opposite to each other, and a sealing structure 3 sandwiched between the first substrate 1 and the second substrate 2. Specifically, the sealing structure 3 is provided with one or more voids 31 therein (namely, the sealing structure has voids and non-void parts), and a filler 32 is provided within the one or more voids 31 and include a gas-absorbing material.

According to embodiments of the present disclosure, within the encapsulation structure, there arranged one or more voids in a sealing structure and the one or more voids are provided with a gas-absorbing material. Accordingly, when the outer side of the sealing structure is subject to being worn out or damaged, the gas-absorbing material is inclined to absorb water vapor (moisture) in the air, which results in forming a buffer zone for further protection, thereby improving anti-water-oxygen performance of the OLED device and service lifespan of the display device greatly.

Herein, the gas-absorbing material is a mixture of alkaline earth metal oxide and molecular sieves. And the alkaline earth metal oxide accounts for 60%~80% of the gas-absorbing material in terms of mass, for example, approximately 65%, 70%, 75% and so on. Further, the alkaline earth metal oxide includes at least one of magnesium oxide and calcium oxide.

Figure 2:
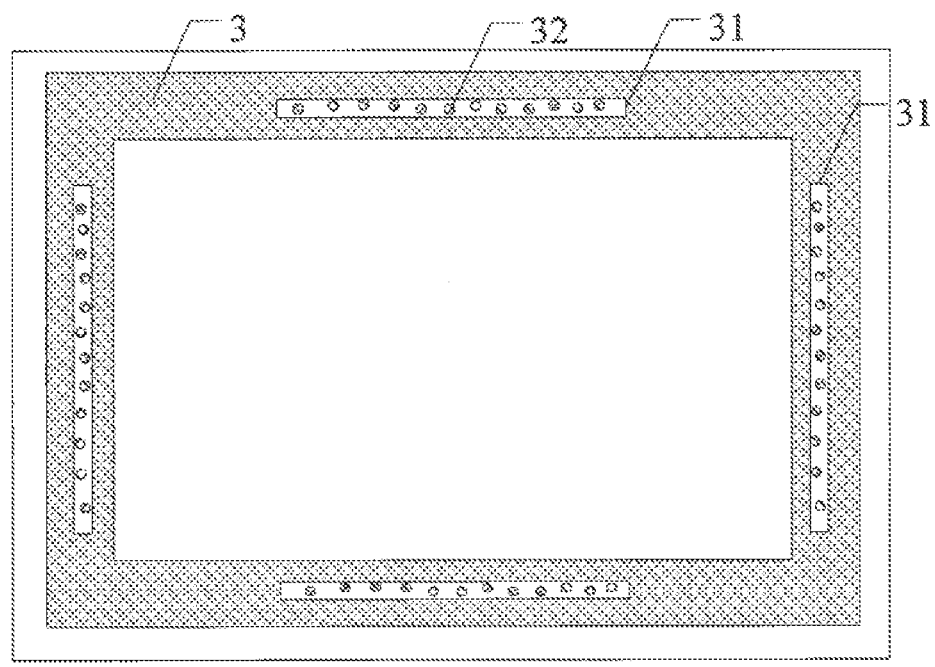
FIG. 2 is a top view diagram illustrating another encapsulation structure provided by embodiments of the present disclosure.

Specifically, according to the encapsulation structure provided by embodiments of the present disclosure, shape and pattern of the voids are arranged in accordance with different situations. For example as shown in FIG. 2, voids 31 are merely arranged at certain regions of the encapsulation structure. Alternatively, the shape and pattern of the voids can be tailored into loop-like voids in line with the encapsulation structure, and the sealing structure is divided into a plurality of loop-like sealing units nested with one another by such loop-like voids. As a result, the voids are distributed at respective positions of the encapsulation structure, such that respective positions of the encapsulation structure are immune from being worn out or damaged. For example, 2~5 rounds of the loop-like sealing units may be formed at the encapsulation structure by varying a number of the formed loop-like voids.

Figure 3:
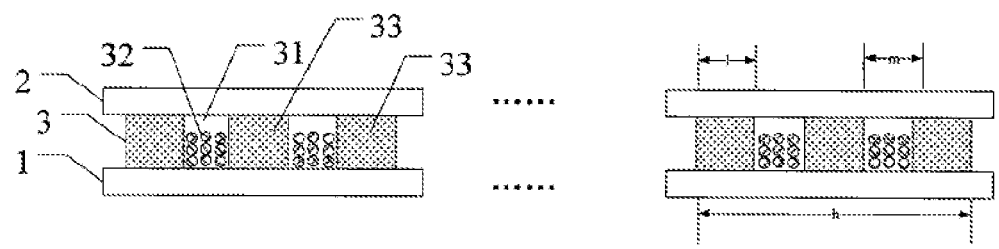
FIG. 3 is a cross sectional diagram illustrating still another encapsulation structure provided by embodiments of the present disclosure.
Figure 4:
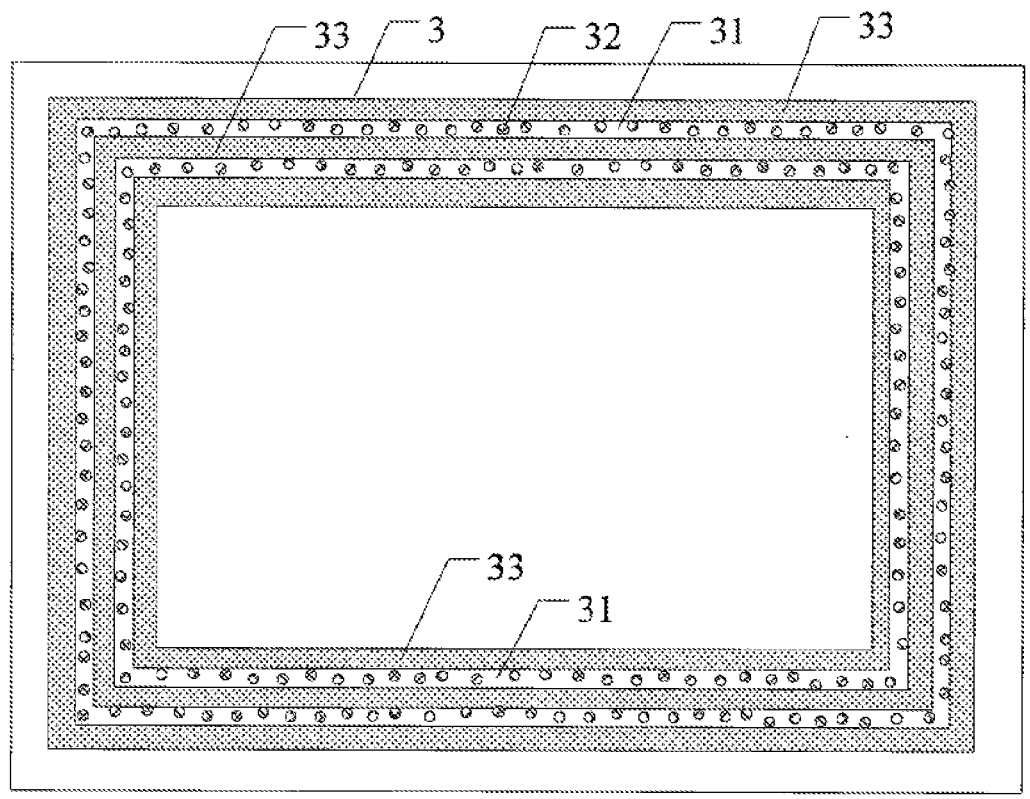
FIG. 4 is a top view diagram illustrating yet still another encapsulation structure provided by embodiments of the present disclosure.

Specifically, different embodiments of the present disclosure are shown in FIG. 3 and FIG. 4. FIG. 3 is a cross sectional diagram illustrating still another encapsulation structure provided by embodiments of the present disclosure. FIG. 4 is a top view diagram illustrating yet still another encapsulation structure provided by embodiments of the present disclosure.

As shown in FIG. 3, the encapsulation structure includes a first substrate 1 and a second substrate 2 arranged opposite to each other, and a sealing structure 3 sandwiched between the first substrate 1 and the second substrate 2. Herein, the sealing structure 3 includes three rounds of loop-like sealing units 33 nested with one another with a same center, and there is a gap between any two neighboring loop-like sealing units 33 so as to form the voids 31. Each of the voids 31 is provided with a filler 32, which includes the above gas-absorbing material. It can be appreciated that a number of the loop-like sealing units 33 is not limited to three as shown in FIG. 3, but may also be other suitable numbers.

Herein, according to the above encapsulation structure, a total width of the sealing structure may be within 2.0~3.0 mm. Specifically, a width indicated by a reference sign "l" of each of the plurality of loop-like sealing units has a range of 0.3~1.0 mm, and a gap width (pitch) indicated by a reference sign "m" between any two neighboring loop-like sealing units has a range of 0.1~1.0 mm. Further, the width of a loop-like sealing unit and the width of a void can be designed according to actual needs. For example, in a situation where the sealing structure has one round of void and two rounds of loop-like sealing units, the width of each of loop-like sealing units is set as approximately 0.9 mm and the width of void is set as approximately 0.2 mm, such that a total width of the sealing structure is approximately 2 mm. Alternatively, in another situation where the sealing structure has two rounds of voids and three rounds of loop-like sealing units, the width of the outermost loop-like sealing unit is set as approximately 0.6 mm, the width of the middle and innermost loop-like sealing units is set as approximately 0.5 mm and the width of each of the voids is set as approximately 0.2 mm, such that a total width of the sealing structure is approximately 2 mm.

It should be noted that in the present disclosure, with respect to each of the loop-like sealing units, it is either of a continuous loop as shown in FIG. 4, or of a discontinuous loop as shown in FIG. 2.

Alternatively, in the encapsulation structure provided by embodiments of the present disclosure, the filler arranged in the void(s) further include a heat-absorbing material. The heat-absorbing material plays a role of absorbing heat released from a melting process of the sealing materials during a fabricating process of the sealing structure, while slowly releasing heat during a cooling process, which mitigates strains and stresses caused by a dramatic change in terms of temperature of the sealing materials, thereby improving the yield.

Further, the heat-absorbing material includes metal particles having black nickel coating, black chromium coating, or black cobalt coating. Alternatively, the heat-absorbing material may include other solid particle materials having a heat-absorbing performance.

Alternatively, in the encapsulation structure provided by embodiments of the present disclosure, the filler includes a plurality of spherical particles each having the gas-absorbing material and the heat-absorbing material. Herein, a particle diameter of each of the plurality of spherical particles is within a range of 0.05~0.2 mm. For example, a particle diameter of each of the plurality of spherical particles in the voids is set as not exceeding 0.2 mm and has an average value of 0.1 mm.

Further, a display device is provided by embodiments of the present disclosure, which includes the above encapsulation structure. The display device may be a laptop computer, a liquid crystal display (LCD) monitor, an LCD TV, a digital photo frame, a mobile phone, a tablet computer, and other products or components having the display function.

Further, an encapsulating method is also provided by embodiments of the present disclosure, which includes: providing a first substrate; providing a second substrate; coupling the first substrate to the second substrate. Herein a sealing structure is sandwiched between the first substrate and the second substrate, the sealing structure is provided with one or more voids and non-void parts, and the filler is provided within the one or more voids and include a gas-absorbing material.

Alternatively, the method further includes irradiating an encapsulation region between the first substrate and the second substrate by using laser rays.

Herein, the gas-absorbing material is a mixture of alkaline earth metal oxide and molecular sieves. And the alkaline earth metal oxide accounts for 60%~80% of the gas-absorbing material in terms of mass, for example, approximately 65%, 70%, 75% and so on. Further, the alkaline earth metal oxide includes at least one of magnesium oxide and calcium oxide. In one embodiment, the non-void parts of sealing structure are formed by glass adhesive.

Alternatively, the sealing structure includes a plurality of loop-like sealing units nested with one another; and there is a gap between any two neighboring loop-like sealing units so as to form the void.

Herein, with respect to an OLED product, the first substrate may either be a cover plate, or be an array substrate. When the first substrate is a cover plate, then the second substrate is an array substrate and vice versa.

For example, as for a 46-inch OLED product, two rounds (i.e., the inner round and the outer round) of loop-like glass adhesive units are fabricated by a screen printing or dispensing process on the cover plate. A width of each of two rounds of loop-like glass adhesive units is set as approximately 0.9 mm, and a width of the middle void is set as approximately 0.2 mm, such that a total width of the glass adhesive structure is approximately 2 mm. After the glass adhesive units are formed, organic components inside the glass adhesive are removed first by a high temperature baking process. Then the gas-absorbing material is arranged in the void between two rounds of loop-like glass adhesive units by a dispensing process. The cover plate and the array substrate (on which a TFT pixel array and OLED devices are formed) are laminated together. And then the glass adhesive is irradiated by using laser rays, such that two substrates are adjoined together by using molten glass material after the glass adhesive is subject to melting down by laser irradiation.

Alternatively, as for a 55-inch OLED product, three rounds of loop-like glass adhesive units are fabricated by a screen printing or dispensing process on the cover plate. A width of the outermost round of loop-like glass adhesive units is set as approximately 0.6 mm, a width of middle and the inner most rounds of loop-like glass adhesive units is set as approximately 0.5 mm, and a width of each of two rounds of voids is set as approximately 0.2 mm, such that a total width of the glass adhesive structure is approximately 2 mm. After the glass adhesive units are formed, organic components inside the glass adhesive are removed first by a high temperature baking process. Then the gas-absorbing material is arranged in two rounds of voids by a dispensing process. The cover plate and the array substrate (on which a TFT pixel array and OLED devices are formed) are laminated together. And then the glass adhesive is irradiated by using laser rays, thereby achieving a sealing process of the OLED product.

Alternatively, in the encapsulating method provided by embodiments of the present disclosure, the filler arranged in the voids further includes a heat-absorbing material. The heat-absorbing material plays a role of absorbing heat released from a melting process of the glass material, while slowly releasing heat during a cooling process, which mitigates strains and stresses caused by a dramatic change in terms of temperature of the glass material, thereby improving the yield.

Further, the heat-absorbing material includes metal particles having black nickel coating, black chromium coating, or black cobalt coating. Alternatively, the heat-absorbing material may include other solid particle materials having a heat-absorbing performance.

The embodiments described above are merely for illustrating the present invention, and are not intended to limit the present invention. Persons of ordinary skill in the art may derive various changes and variations without departing from the spirit and scope of the present invention. Such equivalent technical solutions shall pertain to the protection scope of the present invention.

What is claimed is:

1. An encapsulation structure, comprising a first substrate and a second substrate arranged opposite to each other, a sealing structure provided between the first substrate and the second substrate, and provided with one or more voids, and a filler provided within the one or more voids and including a gas-absorbing material and a heat-absorbing material to mitigate strains and stresses caused by a change in temperature of the sealing structure.

2. The encapsulation structure according to claim 1, wherein the sealing structure includes a plurality of loop-like sealing units nested with one another; and wherein there is a gap between any two neighboring loop-like sealing units so as to form the void.

3. The encapsulation structure according to claim 2, wherein each of the plurality of loop-like sealing units has a width range of 0.3~1.0 mm, and a gap between any two neighboring loop-like sealing units has a width range of 0.1~1.0 mm.

4. The encapsulation structure according to claim 2, wherein a number of the plurality of loop-like sealing units is within a range of 2~5.

5. The encapsulation structure according to claim 1, wherein the gas-absorbing material is a mixture of alkaline earth metal oxide and molecular sieves.

6. The encapsulation structure according to claim 5, wherein the alkaline earth metal oxide accounts for 60%~80% of the gas-absorbing material in terms of mass.

7. The encapsulation structure according to claim 1, wherein the heat-absorbing material includes metal particles having a black nickel coating, a black chromium coating, or a black cobalt coating.

8. The encapsulation structure according to claim 1, wherein the filler includes a plurality of spherical particles having the gas-absorbing material and the heat-absorbing material.

9. The encapsulation structure according to claim 8, wherein a particle diameter of each of the plurality of spherical particles is within a range of 0.05~0.2 mm.

10. A display device comprising the encapsulation structure according to claim 1.

11. An encapsulating method comprising:
providing a first substrate;
providing a second substrate; and
coupling the first substrate to the second substrate,
wherein a sealing structure is provided between the first substrate and the second substrate, wherein the sealing structure is provided with one or more voids and non-void parts, and wherein a filler is provided within the one or more voids and includes a gas-absorbing material and a heat-absorbing material to mitigate strains and stresses caused by a change in temperature of the sealing structure.

12. The encapsulating method according to claim 11, further comprising irradiating an encapsulation region between the first substrate and the second substrate by using laser rays.

13. The encapsulating method according to claim 11, wherein the sealing structure includes a plurality of loop-like sealing units nested with one another; and wherein there is a gap between any two neighboring loop-like sealing units so as to form the void.

14. The encapsulating method according to claim 13, wherein each of the plurality of loop-like sealing units has a width range of 0.3~1.0 mm, and a gap between any two neighboring loop-like sealing units has a width range of 0.1~1.0 mm.

15. The encapsulating method according to claim 14, wherein a number of the plurality of loop-like sealing units is within a range of 2~5.

16. The encapsulating method according to claim 11, wherein the gas-absorbing material is a mixture of alkaline earth metal oxide and molecular sieves.

17. The encapsulating method according to claim 16, wherein the alkaline earth metal oxide accounts for 60%~80% of the gas-absorbing material in terms of mass.

18. The encapsulating method according to claim 11, wherein the non-void parts of the sealing structure are formed by glass adhesive.

* * * * *